United States Patent [19]

Soohoo et al.

[11] 4,257,111

[45] Mar. 17, 1981

[54] DIGITAL-TO-ANALOG OPTICAL RECORDER

[75] Inventors: Jack E. Soohoo, Fountain Valley; Michael J. McNutt, Yorba Linda; Shi-Kay Yao, Anaheim; Cecil L. Hayes, Placentia; Richard A. Gudmundsen, Santa Ana, all of Calif.

[73] Assignee: Rockwell International Corporation, El Segundo, Calif.

[21] Appl. No.: 81,418

[22] Filed: Oct. 3, 1979

[51] Int. Cl.³ .............................................. G11C 13/00
[52] U.S. Cl. ..................................... 365/114; 365/45; 307/607; 350/DIG. 1
[58] Field of Search ................. 365/45, 174, 114, 115; 307/238; 350/DIG. 1

[56] References Cited

U.S. PATENT DOCUMENTS

| 4,011,442 | 3/1977 | Engder | 365/114 |
|---|---|---|---|
| 4,081,794 | 3/1978 | Parks | 365/114 |

Primary Examiner—Terrell W. Fears
Attorney, Agent, or Firm—H. Fredrick Hamann; Daniel R. McGlynn; Wilfred G. Caldwell

[57] ABSTRACT

A digital-to-analog optical recorder incorporating both CCD and integrated optics technologies which is fabricated as a single integral unit including an electro-optical layer portion and a semiconductor layer portion. Sampling circuits and digital-to-analog converters are implemented on the semiconductor layer portion using CCD technology, and a plurality of optical channel waveguides and electro-optical modulators are implemented on the electro-optical layer portion. Each digital signal is converted into two complementary light spots at the output of the recorder.

19 Claims, 6 Drawing Figures

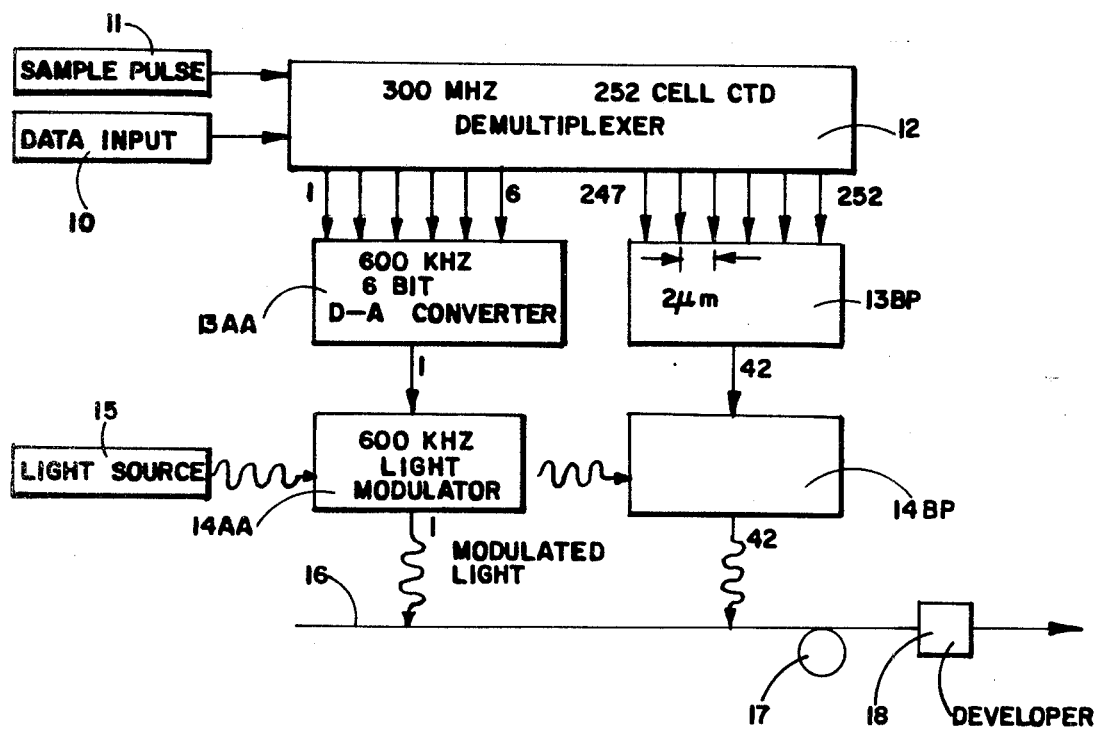

DIGITAL-TO-ANALOG OPTICAL RECORDER

BACKGROUND OF THE INVENTION

Various types of optical recorders are known in the prior art which are associated with digital data. These include computer output microfilm (COM) systems, laser printers, and electro-optical memories. In all of these prior art configurations, a digital signal is converted into an analog signal which controls the amplitude of a light beam. The light beam is directed at a radiation sensitive medium which records the signal applied thereto, thereby storing the information contained therein.

One closely related prior art electro-optical modulator array and recorder is described in U.S. Pat. No. 3,841,733, which discloses an optical waveguide system for producing a line of modulated radiation data for recording on a color film. U.S. Pat. No. 4,003,632 describes a similar structure which incorporates a floating gate as a charge storage structure. Such a floating gate is however associated in that patent with a semiconductor memory element, and information written into or read from such memory element by the light or propagating in the waveguide exciting or discharging the stored electronic charges. U.S. Pat. No. 4,094,606 describes a plurality of optical waveguides positioned between a common electrode and individual electrodes arrayed along a charged coupled device useful in a xerographic reproduction system.

Such prior art digital-to-analog optical recorders are not simple devices but rather are generally complex systems operating at relatively low speeds. Prior to the present invention there has not been a simple, high-speed and compact digital-to-analog data recorder which can be used in a wide variety of applications.

SUMMARY OF THE INVENTION

Briefly, and in general terms, the invention relates to a digital-to-analog optical recorder for interfacing a digital system having high speed data output with an optical recording media. More particularly, the invention concerns a single, integral unit including an electro-optical layer portion and a semiconductor layer portion. Sampling circuits and digital-to-analog converters are implemented on the semiconductor layer portion using CCD technology, and a plurality of optical channel waveguides and electro-optical modulators are implemented on the electro-optical layer portion. Each digital signal is converted into two complementary light spots at the output of the recorder. The single integral package according to the present invention provides a simple, easy-to-use, reliable, and low-cost device.

The present invention provides a device for recording representations of a sequence of information words, each information word being composed of information bits having at least two values comprising: a source of digital input data comprising an input sequence of information bits, consecutive bits in the input sequence corresponding to information bits in different ones of the information words; pulse generating means for producing in sequence of pulses; delay means having an input connected to the pulse generating means, and a plurality of outputs for producing a sequence of time delayed pulses from the sequence of pulses; a plurality of sampling circuits, each having a first input connected to the source of digital input data, and a second input connected to a corresponding one of the outputs of the sample pulse generating means; each of the sampling circuits functioning to select a specific bit of the consecutive bits in the input sequence; a digital-to-analog converter having an n-bit digital input connected to the respective sampling circuits, an n-bit information word being formed thereby wherein n is a positive integer, and an analog output; a source for providing a recording signal; and modulating means connected to the analog output of the digital-to-analog for modulating the recording signal in accordance with the n-bit information word.

The function of the digital-to-analog optical recorder according to the present invention is to take a high speed serial data bit stream and to convert it into permanent storage on media such as film. Another embodiment of the present invention provides a multi-chip system which is pulsed at an extremely high rate so that during any one time interval only one data conversion chip is performing the processing. By dividing the processing task among a plurality of chips, each with a limited speed, the present invention achieves a higher throughput rate.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

DESCRIPTION OF THE PREFERRED EMBODIMENTS

Figure 1:
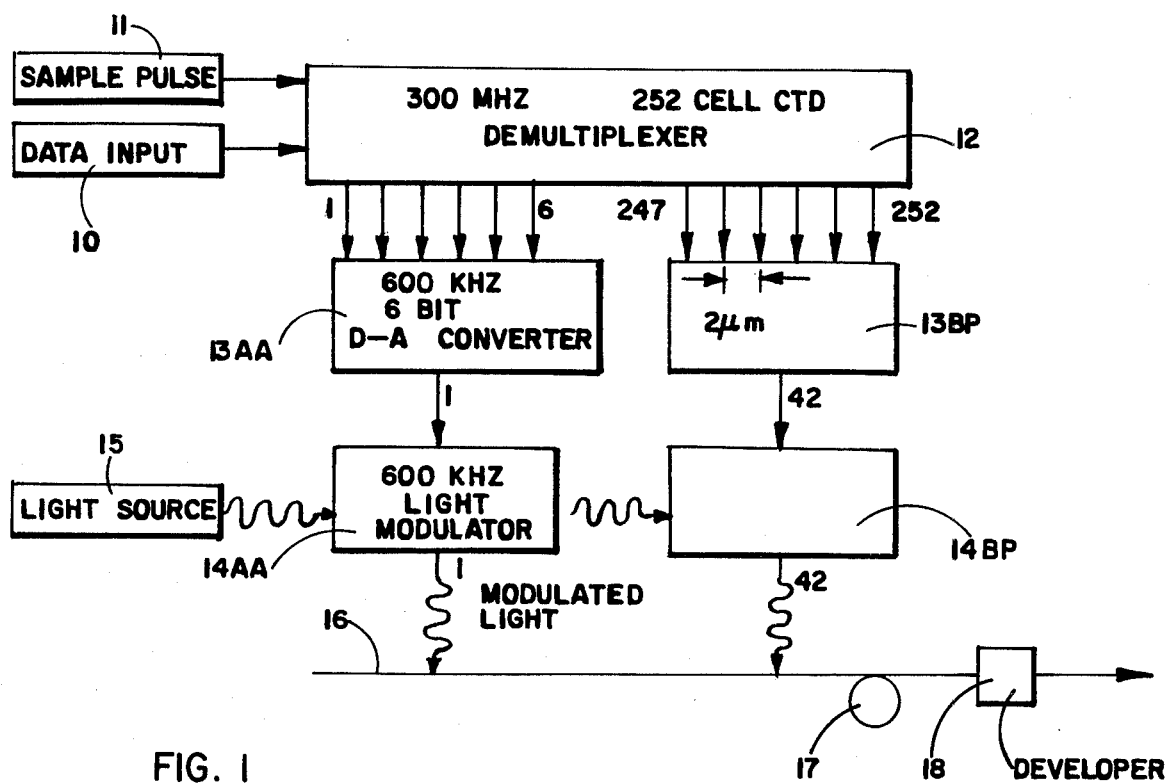
FIG. 1 is a highly simplified block diagram of the digital-to-analog optical recorder according to the present invention.

FIG. 1 shows a highly simplified block diagram of the basic digital-to-analog optical recorder according to the present invention. FIG. 1 shows a high speed data input 10 representing digital data to be converted into an analog signal and stored. The particular coding or bit-pattern of the input data stream is a function of the demultiplexing arrangement. The data input 10 is connected to the CCD demultiplexer circuit 12, which functions to convert the serial data stream into a plurality of n-bit channels. The "n" refers to the $2^n$ discrete analog levels in the ultimate analog signal.

In the preferred embodiment shown in the FIGURE, the demultiplexer consists of 252 charge transfer device (CTD) cells which functions to convert the serial data stream into a parallel stream of forty-two 6-bit channels, i.e. a total of 262 parallel outputs labelled "1" through "252" in the FIGURE.

A sample pulse input 11 is also provided for the demultiplexer 12, the function of which will be explained later in connection with FIGS. 3 and 4.

The outputs of the dimultiplexer 12 are connected to a plurality of CCD digital-to-analog converters 13AA-13BP.

In the preferred embodiment shown in the FIGURE, there are 42 such D-A converters, labelled 13AA, 13AB, 13AC, 13AZ, 13BA, 13BB, ... 13BP. Only the first (13AA) and last (13BP) are shown for simplicity. The D-A converter output are connected to a corresponding plurality of electro-optical modulator arrays of the waveguide type 14AA-14BP which will be described subsequently with reference to FIG. 2. The modulator arrays 14AA-14BP function to modulate a light beam originating from a light source 15 (preferably a laser), to produce a sequence of modulated light beams 1, ... 42. The output from the modulators consist of spots of intensity modulated light which are directed to the surface of a photo-sensitive media 16, such as a film. The media 16 is moved past the intensity modulated light beam by means of a film transport mechanism 17. The exposed media 16 is then transported into a film developer 18 which permanently affixes the information to the film for permanent storage.

As an example of the operation of the present invention, to convert input digital data which is supplied at a rate of $3.6 \times 10^8$ spots per second, there would be required 24 serial channels. The number of serial channels required is dependent upon the channel speed. The channel speed assumed is 300 MHz. One serial channels would have 252 parallel output lines connecting to each 42 digital-to-analog converters, all on a single chip. The input digital signal would be simultaneously applied to the input of all of the channels and a sequence of narrow pulses at a 300 MHz repetition rate would be used to sequentially switch the channels on the various chips for data loading. In the present example, half of the serial channels would be outputing data to the digital-to-analog converters in a parallel manner, while at the same time the other half of the channels are being serially loaded.

The description of the electro-optical modulator array as used by the present invention will be summarized here. The modulator array is more fully described in copending U.S. Patent Application Ser. No. 081,419, filed concurrently with the present application, and which is incorporated herein by reference.

Figure 2:
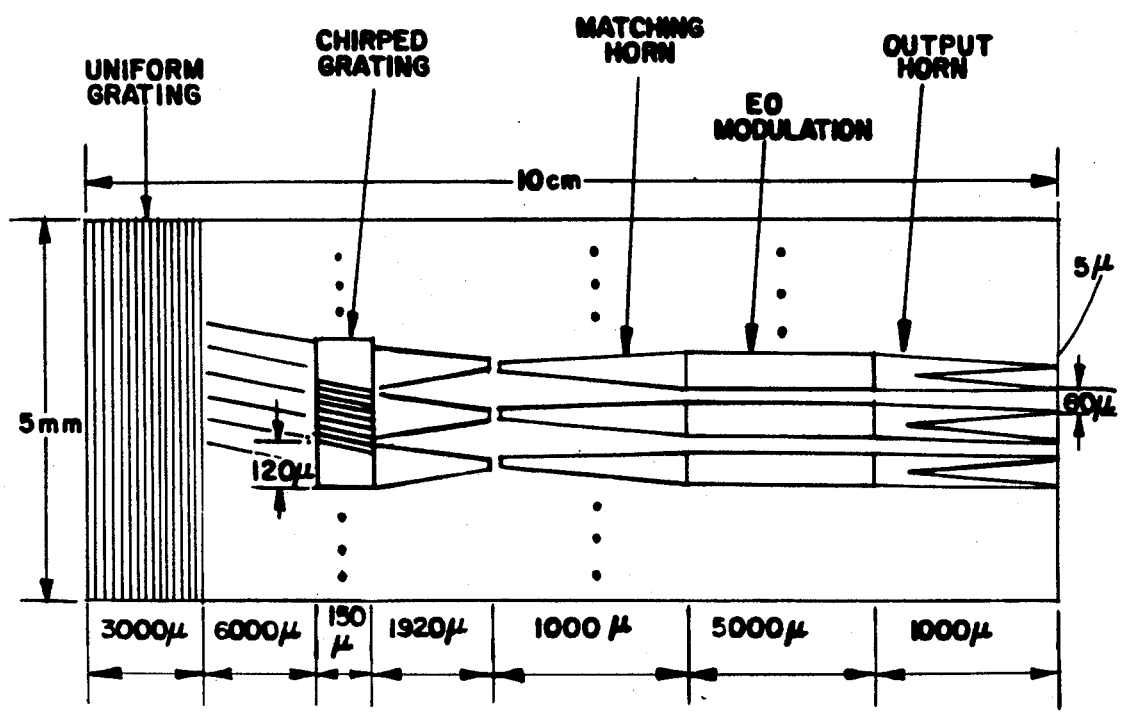
FIG. 2 is a top surface plan view of the electro-optical modulator array used in the present invention.

Turning now to FIG. 2, there is shown a top surface plan view of the electro-optical modulator array used in the present invention. In more detail it is noted that to the extreme left-hand side of the FIGURE is a uniform grating which consists of a series of parallel lines or bars extending along the major surface of the electro-optical crystal. The function of the uniform grating is to convert an incident ribbon of coherent light, such as might be generated by a laser, into a traveling wave propagating in an optical waveguide on the surface of the wafer. The uniform grating is approximately 5 mm in width and 300 microns in length. It may be etched on the crystal surface as surface corrugation, or alternatively it could be deposited as an overlay film with a periodic structure. Such gratings are known in the prior art and permit an efficient conversion from the incident optical beam to a guided optical wave traveling along the surface of the wafer transverse to the parallel strips of the uniform grating.

Approximately 6,000 microns away from the edge of the uniform grating is placed in array of chirp gratings, one of which is shown for simplicity in the FIGURE. The function of each of the chirp gratings is to form an optical lens for the guided optical waves traveling along the surface so that the optical waves are focused into the electro-optical modulator channels also provided on the surface of the electro-optical crystal.

Optical lenses for guiding optical waves are also known in the prior art and may be fabricated from thin film technology such as Luneburg lens technology, geodesic Luneberg lens technology or grating diffraction lens technologies. Each of these technologies are sufficiently well advanced so as to produce diffraction limited focusing. The thin film Luneburg lens does have a draw back in that it is not fully compatible with Ti-LiNbO3 electro-optical crystal waveguides, and the geodesic Luneburg lens is difficult to make and align optically.

Therefore in the preferred embodiment of the present invention, the chirp grating diffraction lens is used, since it can be made easily into a highly packaged array as required in the intended applications of the present invention. The chirp grating lens can be made in the same way as the uniform grating input coupler previously described that is, by either etching or deposition on the crystal surface. With such structures it is possible to achieve optical throughput efficiency exceeding 90%. It is possible, moreover, that the grating coupler and chirp grating lens could be made in one photolithographic process with a single mask or with a single E beam fabrication procedure. In any event, the important feature of this type of lens is its relative insensitivity to process variations.

The light emitting from the array of chirp gratings is focused into the entrance port of an array of maching horns also implemented on the surface of the electro-optical crystal. The distance between the exit of the chirp grating and the entrance of the corresponding matching horn is approximately 1,920 microns. Each matching horn has a length of 1,000 microns and functions to achieve a quasi planar optical wavefront of finite dimensions. The output of each matching horn is connected to a corresponding electro-optical modulator.

The electro-optical (EO) modulator according to the above-cited patent application provides planar electrodes located side by side on the major surface of the electro-optical crystal. The optical wave front propagated through the electrode region will be phase modulated due to the electro-optically induced index of refraction variation. In order to convert such phase modulation to amplitude or intensity modulation, two basic schemes may be used:

1. Interfering two optical wave fronts of opposited phase modulation polarity, depending upon the phase modulation depth, so that the intensities of the two output optical channels vary according to the following equation:

$$I_t = I_o \cos^2(\frac{2\pi \Delta nL}{\lambda})$$
$$I_d = I_o \sin^2(\frac{2\pi \Delta nL}{\lambda}),$$

where $\Delta n$ is the induced optical index of refraction, L is the interaction length, and $\lambda$ is the optical wavelength.

2. By Bragg diffraction out of an electro-optical phase grating, so that the optical intensities are:

$$I_t = I_o \cos^2(\frac{\pi \Delta n L}{\lambda})$$
$$I_d = I_o \sin^2(\frac{\pi \Delta n L}{\lambda}).$$

It is noted that the two types of modulators behave similarly with the former device requiring only half the modulation index $\Delta n$, and therefore only half of the signal voltage. The parameter $\Delta n$ is related to the signal voltage $V_s$ by the equation:

$$\Delta n = \frac{n_o^3}{2} \gamma \Gamma \frac{V_s}{d}.$$

where $n_o$ is the optical index of refraction, $\gamma$ is the relevant electro-optical coefficient, $\Gamma$ is a constant related to the effectiveness of the modulator and in magnitude less than 1, and d is the electrode center to center separation.

The output of the EO modulator is then applied to a corresponding output horn.

The output horn extends over a distance of 1,000 microns on the surface of the electro-optical crystal. The horn converges into a series of dual spots which are approximately 5 microns in width and spaced approximately 60 microns apart. The spots are placed at the edge of the electro-optical crystal so that the information can be transmitted into another media, such as recorded on a storage media or transmitted through a fiber optic cable.

It is noted that there are associated with each of the EO modulators an output consisting of two light spots. The two light spots are complementary to one another (i.e. if one light spot has an intensity "x", the other light spot has an intensity "1−x", where "1" is the maximum intensity of a spot).

The two light spots permit an error check to be performed, since any uncertainty concerning the intensity of a given light spot may be verified using the complementary light spot.

The distance between the spots of 60 microns is longer than may actually be desired for high density recording. It is possible to increase the recording density by stacking the electro-optical chips in layers one on top of another with the light spots of adjacent layers offset from one another. As an example, two chips may be used with the spots offset by 30 microns. The resulting recording will have the recorded informational spots separated by 30 microns.

The electro-optical crystal (typically LiNbO$_3$) is approximately one millimeter in thickness and composed of two layers, a first upper layer and a second lower layer which has a titanium diffused portion. With the proper control of the titanium deposition and diffusion process, a single mode optical wave guide with a propagation loss as low as 1 db/cm can be produced in the titanium diffused portion. For optical wave lengths longer than 6,328 Angstroms the optical damage effect in the electro-optical crystal is not a serious threat because of the relatively few miliwatts of optical power generated. One alternative crystal to use is TiLiTaO$_3$ which has an optical damage threshold more than an order of magnitude greater than that of LiNbO$_3$.

Below and parallel the electro-optical crystal is a silicon wafer having a major surface which faces the diffused major surface of the electro-optical crystal.

The silicon wafer consists of a p-type substrate, an n-type epitaxial layer thereover, and a layer of silicon dioxide in turn over the n-type epitaxial layer. An array of CCD cells, and in particular, a digital-to-analog converter is formed on the silicon wafer. The preferred embodiment for such a CCD digital-to-analog converter is described in copending U.S. Patent Application, Ser. No. 048,960, filed June 15, 1979 incorporated herein by reference. An output from such a CCD converter is preferably fabricated as an aluminum strip. Such an output corresponds to only one in a plurality or array of substantially identical CCD cells and corresponding digital-to-analog converters on the surface of the silicon wafer. For a plurality of channels there are corresponding digital-to-analog converters and therefore a corresponding number of digital-to-analog converter outputs on the surface of the silicon wafer. The CCD output is a metal connector composed of aluminum which connects the CCD output with a corresponding electrode located on the surface of the electro-optical crystal. The metal strip on the electro-optical crystal forms a portion of the electro-optical modulator and functions to create a charge in the diffused region of the electro-optical crystal. The metal conductor provides an electrical connection between the D/A output on the silicon wafer and modulator strip on the electro-optical wafer, and therefore provides a direct correspondence between a specific digital-to-analog converter on the silicon wafer and a specific electro-optical modulator on the surface of the electro-optical crystal. In the preferred embodiment, there are a plurality of electro-optical modulators corresponding to different optical channels on the surface of the electro-optical crystal, and a corresponding plurality of digital-to-analog converters corresponding to different digital signal channels on the surface of the silicon wafer. There is a one-to-one correspondence between the digital signal channels on the silicon wafer and the optical channels on the electro-optical crystal. The two wafers, that is the electro-optical crystal wafer and the silicon wafer, are independently produced with the electro-optical integrated optic structure and the integrated circuit respectively and are then placed with major surfaces facing one another and are aligned so that the channels of the electro-optical crystal correspond and make electrical contact with corresponding digital channels in the silicon wafer.

Figure 3:
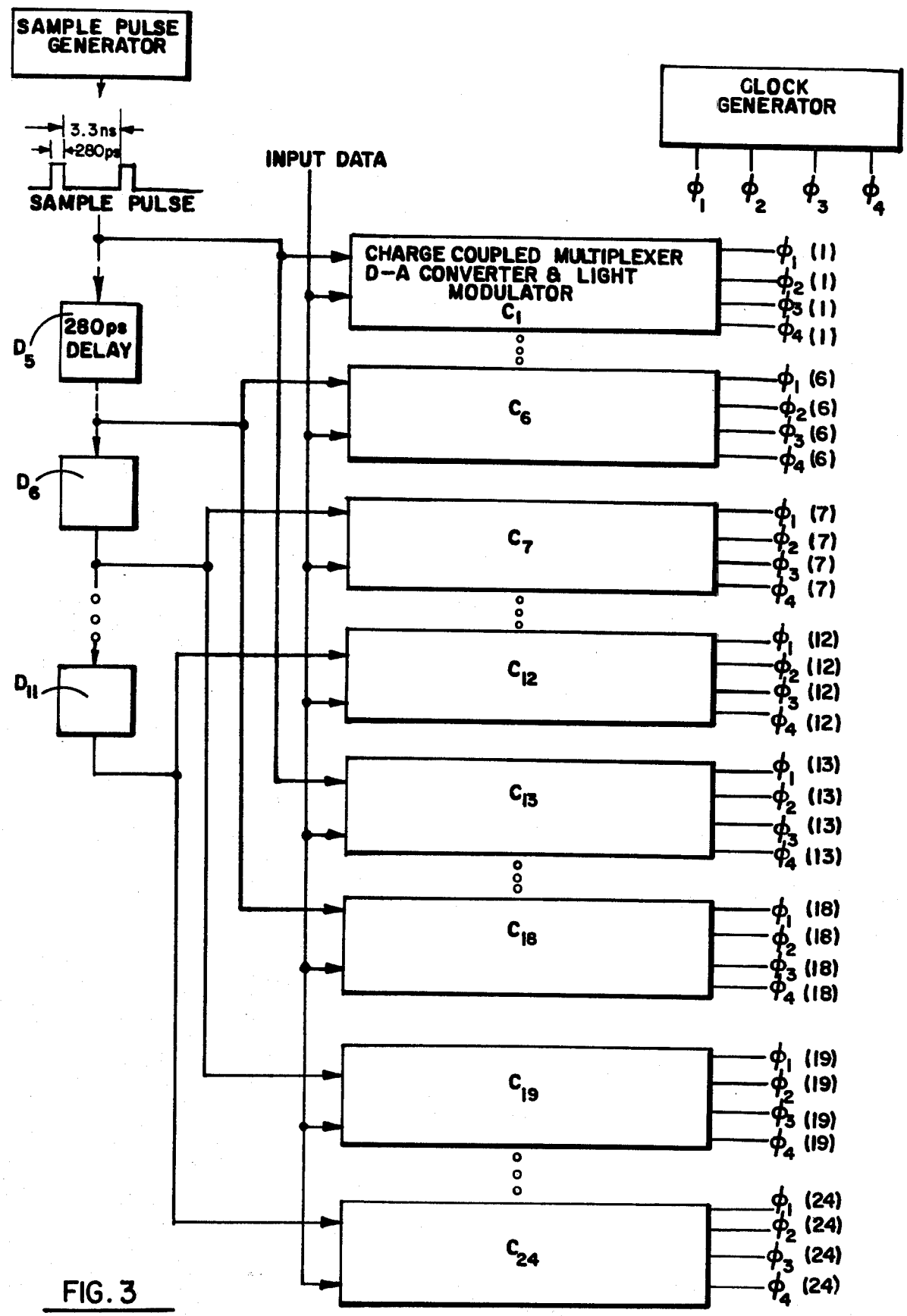
FIG. 3 is a more detailed block diagram of the digital-to-analog optical recorder implemented in a 24-chip system.

Referring now to FIG. 3 there is shown a highly simplified block diagram of a 24-chip system showing the input sample timing according to the present invention. The 24 chips are labeled C1 through C24. Each chip has a first input connected to a sampling pulse generator, and a second input connected to the data input. The input data line is connected to each of the 24 charge transfer devices at their n+ diffusion sources and the data is therefore applied simultaneously to each of the 24 chips. Determination of which data in the input data stream would be selected by which chip is determined by the timing pulse applied to the chips by the sampling pulse generator. The bit rate of the data stream on the input data line, the timing of the timing generator and the delays D1-D11, as well as the number of chips in the system are all closely related. For operation of the unit at 3.6 GHz, the pulse generator generates a sequence of 280 picosecond pulses at 3.3 nanosecond intervals. Such picosecond pulses may be generated by commercially available equipment, such as the Hewlett Packard 5359A time synthesizer. This timing is chosen so that each device samples every 12th bit at a 300 MHz rate, the speed of the CCDs. To provide the proper sequence of sampling in each chip, the pulse train goes through a sequence of delay modules labeled D1-D11 in FIG. 2. The first charge-coupled demultiplexer module C1 gets the undelayed pulse, the second demultiplexer chip C2 gets a pulse delayed by 280 ps, etc., until the 12th chip which gets a pulse delayed by 11×280 pc=3.08 ns. At the end of the sequence, that is after 3.3 nanoseconds, a new pulse arrives in the pulse train to begin the sequence over again. Note that a pair of CCD demultiplexers are connected to the output of each delay element, that is C12 and C24 are connected to the output of D11, C7 and C19 are connected to the output CD6, and C6 and C18 are connected to the output of D5, etc. When the charge transfer devices are filled with data, the serial transfer is stopped and the charge packets are output laterally. One of the pair of demultiplexer channels is transferring data serially while the other channel is transferring data laterally. The two paired channels alternate to maintain constant serial input capability.

Figure 4:
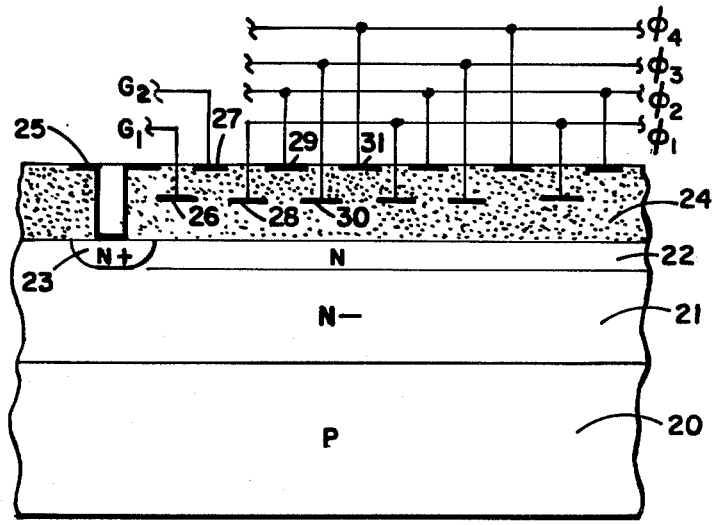
FIG. 4 is a highly simplified cross-sectional view of the input sampling circuit associated with a serial channel found on a single chip used in the digital-to-analog optical recorder of FIG. 1.

FIG. 4 is a highly simplified cross-sectional view of the integrated circuit implementation of the input sampling circuit according to the present invention. There is shown a cross-sectional view of a portion of a semiconductor wafer upon which the sampling circuit, as well as the demultiplexer and D/A converter is implemented.

The circuit according to the present invention is preferably implemented on a p type conductivity silicon wafer 20. On a major surface of the p type silicon wafer 20 is deposited an n— conductivity type epitaxial layer or ion implanted layer 21. The top major surface of the epitaxial or implanted layer 21 is then implanted to form a shallow layer or region 22 which is used to form the active circuit elements. The implanted region 22 in the present embodiment is an n type conductivity layer disposed on the n— type epitaxial layer 21. The purpose of the shallow implant region 22 is to provide a charge storage region linearly proportional to voltages on the insulated gates. Also provided on the major surface of the epitaxial layer 21 is a diffused region 23, which is of n+ type conductivity for making an ohmic contact to the input data line. Overlying the region 22 is a dielectric insulating region 24, preferably of silicon dioxide.

The input data line 25 is implemented by means of a conductive terminal 25 which makes physical and electrical contact with the n+ diffused region 23. Closely adjacent the implanted region 23 is a series of gates 26 and 27, which are disposed on the SiO₂ region 24 which overlies the n implanted region 22 on the silicon wafer. Such gates form a charge partition input which operates to transfer a signal from the input 25 along the n implant 22 to be further utilized in the circuit.

The operation of the input sampling circuit will be subsequently described with reference to FIGS. 5 and 6.

Also shown in FIG. 4 are various gates 26, 27, 28, 29, 30, 31, etc., and signal sources $G_1$, $G_2$, $\phi_1$, $\phi_2$, $\phi_3$, and $\phi_4$. More particularly, the FIGURE shows the $G_1$ gate 26, the $G_2$ gate 27, a $\phi_1$ gate 28, a $\phi_2$ gate 29, a $\phi_3$ gate 30, a $\phi_4$ gate 31, and a series of further gates to which are supplied the same signals $\phi_1$, $\phi_2$, $\phi_3$, $\phi_4$, which the gates 28, 29, 30, and 31 respectively are supplied. The specific voltage waveforms which are applied to these gates function to transfer the signal from the input 25 and the implant region 23 along the n implant 22 in the circuit.

Although each of the chips C1-C24 have $\phi_1$, $\phi_2$, $\phi_3$, and $\phi_4$ signals applied thereto, such signals are not always the same from chip to chip. It would therefore be useful to introduce a new notation to specify the specific signal being considered by a subscript with the chip number or numbers in parenthesis. This notation is illustrated in FIG. 5.

Figure 5:
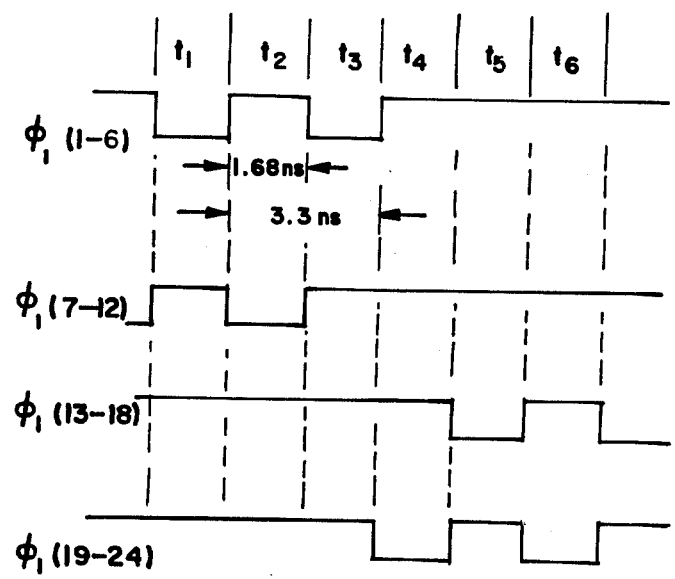
FIG. 5 is a timing diagram of the signals applied to the gates shown in the input circuit shown in FIG. 4.

FIG. 5 is a timing diagram of the signal supplied to the $\phi_1$ gates of chips $C_1$-$C_6$, $C_7$-$C_{12}$, $C_{13}$-$C_{18}$, and $C_{19}$-$C_{24}$ respectively for operating such circuits according to the present invention. Such signals are designated by $\phi_{1\,(1-6)}$, $\phi_{1(7-12)}$, $\phi_{1(13-18)}$, $\phi_{1(19-24)}$ respectively, using a compact notation. What is meant is that the signal designated by $\phi_{1(1-6)}$ is applied to the $\phi_1$ gate of chips $C_1$, $C_2$, $C_3$, $C_4$, $C_5$, and $C_6$; the signal $\phi_{1(7-12)}$ is applied to the $\phi_1$ gate of chips $C_7$, $C_8$, $C_9$, $C_{10}$, $C_{11}$, $C_{12}$, and so on.

Describing FIG. 5 in more detail, during time period $t_1$, $\phi_{1(1-6)}$ is low, $\phi_{1(7-12)}$ is high, $\phi_{1(13-18)}$ is high and $\phi_{1(19-24)}$ is high. During time period $t_2\phi_{1(1-6)}$ is high, $\phi_{1(7-12)}$ is low, $\phi_{1(13-18)}$ is high and $\phi_{1(19-24)}$ is high. During time period $t_3\phi_{1(1-6)}$ is low, $\phi_{1(7-12)}$ is high, $\phi_{1(13-18)}$ is high, $\phi_{1(19-24)}$ is high.

During time period $t_4\phi_{1(1-6)}$ is high, $\phi_{1(7-12)}$ is high, $\phi_{1(13-18)}$ is high and $\phi_{1(19-24)}$ is low. During time period $t_5\phi_{1(1-6)}$ is high, $\phi_{1(7-12)}$ is high, $\phi_{1(13-18)}$ is low and $\phi_{1(19-24)}$ is high. During time period $t_6\phi_{1(1-6)}$ is high, $\phi_{1(7-12)}$ is high, $\phi_{1(13-18)}$ is high and $\phi_{1(19-24)}$ is low.

The time duration of each of the $t_1$ time intervals is 1.68 nanoseconds. This means that the fault period is 3.3 nanoseconds, or that the operation of the CCD demultiplexer takes place at a fequency of 300 MHz, as indicated in FIG. 1. The period for switching between 300 MHz serial transfer and parallel transfer to the D/A converters is 1.67 ns (=1/600 KHz), and switching from serial to parallel or from parallel to serial transfer occurs between $t_3$ and $t_4$ in FIG. 5.

Figure 6:
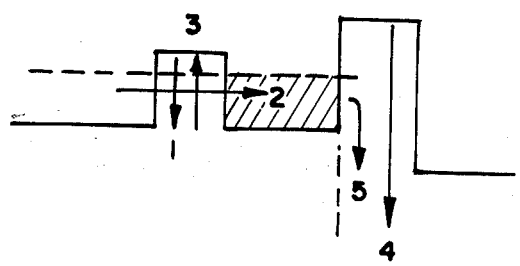
FIG. 6 is a potential diagram of the electrical potential in the n-type layer adjacent the input region of the chip shown in FIG. 4.

Turning now to FIG. 6 there is shown a potential diagram of the potential in the diffused n+ region 23 and the surface implant 22. The horizontal dotted line indicates the potential of the input signal applied to the input diffusion 23. The solid line shows the potential at a particular time. At time $t_0$ a potential barrier is formed under G1 above the horizontal dotted line which represents the potential level of the input signal. At time $t_1$ a sample pulse is applied to gate G1 (electrode 26) lowering the potential as shown by the arrow designated 1. A constant potential is always applied to gate G2 (electrode 27) and therefore the charge flows from the n+ diffused region 23 into the n implant region 22 as shown by the arrow labelled 2 in FIG. 6. After a period 280 picoseconds the potential which has been low returns to its original position shown by the arrow labelled 3. This is achieved by the sample pulse which is applied to the G1 gate.

The next step is to have the potential on the $\phi_1$ gate shown in FIG. 4 lowered. It is noted that in its high position, the charge is trapped in the storage well indicated by the cross-hatched region. This step occurs during the subsequent time period in which a low potential is applied to the $\phi_1$ gate, so that the potential in the region on the right hand side of FIG. 6 is lowered as shown by the arrow labeled 4. After this change in potential takes place the charge which has been stored in the region shown by the cross-hatching then flows in the right hand direction into the area of lower potential, as shown by the arrow labeled 5. This accomplishes the effect of loading the charge into the CCD transfer channel or shift register.

The charge so applied to regions under the gates 29, 30, . . . etc., which operates as a known shift register at a frequency of 300 MHz functions so as to demultiplex the signal into 42 groups of six bits each. Each group of six bits forms a six-bit word which is individually applied to a six-bit digital-to-analog converter 13AA-13BP as shown in FIG. 1. The input data signal has already been coded such that each sequential six-bit field forms a six-bit word ranging from the least significant bit to the most significant bit. Such a word may represent a grey level or intensity level of an optically detected signal or alternatively may represent a signal which is to be coded in the form of an intensity level with a grey level of between $1=2°$ and $64=2^6$. Since such demultiplexers are known in the art, a further description of them is believed unnecessary. It simply consists of a 252 bit or cell charge transfer device receiving a serial input into a shift register and at a predetermined time making a parallel transfer along 252 lines to the 42 digital-to-analog converters as shown in FIG. 1.

It will be obvious to those skilled in the art that the integrated optical and semiconductor device according to the present invention can be manufactured with various technologies and different combinations of known process steps, and that the preferred embodiments illustrated here are merely exemplary. In the semiconductor portion, the depth of penetration of the various zones and regions and in particular the configuration and distance between the active zones of the transistor devices, as well as the concentrations of dopant species, and/or their concentration profiles, can be chosen depending upon the desired properties. These and other variations can be further elaborated by those skilled in the art without departing from the scope of the present invention.

The present invention is also not restricted to the specific semiconductor materials and circuits described. For example, it may be pointed out that semiconductor materials other than silicon, for example $A_{III}$-$B_V$ compounds, and integrated optical materials other than those discussed may be used. Furthermore, the conductivity types in the embodiment may be interchanged and corresponding to such change, the polarity of the respective operating voltages adapted. Moreover, the voltage level and the static or dynamic nature of the signals applied to the various terminals and gates of the device, as well as the voltage sources, may be suitably selected as desired for a particular application.

While the invention has been illustrated and described as embodied in a digital-to-analog optical recorder, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. A device for recording representations of a sequence of information words, each information word being composed of information bits having at least two values comprising:
    a source of digital input data comprising an input sequence of information bits, consecutive bits in said input sequence corresponding to information bits in different ones of said information words;
    pulse generating means for producing a sequence of pulses;
    delay means having an input connected to said pulse generating means, and a plurality of outputs for producing a sequence of time delayed pulses from said sequence of pulses;
    a plurality of sampling circuits, each having a first input connected to said source of digital input data, and a second input connected to a corresponding one of said outputs of said sample pulse generating means;
    each of said sampling circuits functioning to select a specific bit of said consecutive bits in said input sequence;
    a digital-to-analog converter having an n-bit digital input connected to said respective sampling circuits, an n-bit information word being formed thereby where n is a positive integer, and an analog output;
    a source for providing a recording signal; and
    modulating means connected to said analog output of said digital-to-analog converter for modulating said recording signal in accordance with said n-bit information word.

2. A device as defined in claim 1, wherein said source for providing a recording signal is a laser light source.

3. A device as defined in claim 1, wherein said modulating means comprises electric field generating means which functions to produce an electric field with an intensity corresponding to the analog signal on the output of said digital-to-analog converter.

4. A device as defined in claim 1, further comprising: recording media in the path of said modulated beam of light for permanently storing an analog representation of said digital input data.

5. A device as defined in claim 1, wherein said digital-to-analog converter is a charged coupled device circuit for producing electrical charge packets such that the magnitude of the total charge corresponds to the magnitude of the digital signal.

6. A device as defined in claim 3, wherein said electric field generation means comprises a planar capacitor having one electrode connected to said analog output of said digital-to-analog converter.

7. A device as defined in claim 1, further comprising an integrated optical device implemented on a wafer having a diffused surface incorporating an optical channel waveguide for propagating said recording signal.

8. A device as defined in claim 4, wherein said recording media comprises photosensitive film disposed in the path of said modulated beam of light.

9. A device as defined in claim 1, wherein said device is implemented in an integral unit comprising an electro-optical layer portion and a semiconductor layer portion, said modulating means being implemented on said electro-optical layer portion and said sampling circuits and said digital-to-analog converter being implemented on said semiconductor layer portion.

10. A digital-to-analog optical recording system comprising:
- a source of digital input data;
- a source of a recording beam;
- an integral recorder comprising:
  - a semiconductor layer portion including a digital-to-analog converter having an input connected to said source of digital input data, and an output for producing an analog signal corresponding to the digital data; and
  - electro-optical layer portion including an electro-optical modulator connected to said output of said digital-to-analog converter, said modulator being disposed in the path of said recording beam so that said beam is modulated by said analog signal; and
  - recording media in the path of said modulated beam of light for permanently storing an analog representation of said digital input data.

11. A system as defined in claim 10, wherein said source of a recording beam is a laser light source.

12. A system as defined in claim 10, wherein said semiconductor layer portion comprises a silicon wafer.

13. A system as defined in claim 10 wherein said electro-optical layer portion comprises a LiNbO₃ wafer having a diffused surface incorporating an optical channel waveguide.

14. A system as defined in claim 10 wherein said recording medium is a photosensitive film.

15. A system as defined in claim 10, wherein said electro-optical modulator comprises a planar capacitor deposed on the surface of said electro-optical layer portion.

16. A system as defined in claim 10, wherein said electro-optical modulator produces two complementary light spots.

17. A system as defined in claim 10, wherein said digital-to-analog converter functions to produce electrical charge packets such that the magnitude of the total charge corresponds to the magnitude of said digital input data.

18. A system as defined in claim 10, wherein said semiconductor layer portion further comprises a plurality of digital-to-analog converters, each converter provided in a discrete channel in said semiconductor layer portion, and wherein said electro-optical layer portion comprises a corresponding plurality of electro-optical modulators, each modulator provided in a discrete optical waveguide channel on said electro-optical layer portion, each of said modulators corresponding to a respective one of said digital-to-analog converters and electrically connected therewith.

19. A system as defined in claim 10, wherein said digital-to-analog converter is a CCD device.

* * * * *

UNITED STATES PATENT AND TRADEMARK OFFICE
CERTIFICATE OF CORRECTION

PATENT NO. : 4,257,111

DATED : March 17, 1981

INVENTOR(S) : J. E. Soohoo et al

It is certified that error appears in the above-identified patent and that said Letters Patent are hereby corrected as shown below:

In column 2, line 6, delete [wherein] and insert --where--.

In column 3, line 2, delete [262] and insert --252--.

In column 3, line 7, delete [dimultiplexer] and insert --demultiplexer--

In column 3, line 14, delete [output] and insert --outputs--.

In column 3, line 34, delete [channels] and insert --channel--.

In column 4, line 4, delete [in] and insert --an--.

In column 4, line 24, delete [packaged] and insert --packed--.

UNITED STATES PATENT AND TRADEMARK OFFICE
CERTIFICATE OF CORRECTION

PATENT NO. : 4,257,111

DATED : March 17, 1981

INVENTOR(S) : J. E. Soohoo et al

It is certified that error appears in the above-identified patent and that said Letters Patent are hereby corrected as shown below:

In column 4, line 32, delete [and] and insert -- and the --.

In column 4, line 56, delete [opposited] and insert --opposite--.

Signed and Sealed this

Thirteenth Day of October 1981

[SEAL]

Attest:

GERALD J. MOSSINGHOFF

*Attesting Officer*     *Commissioner of Patents and Trademarks*